US008648249B1

(12) United States Patent
West

(10) Patent No.: US 8,648,249 B1
(45) Date of Patent: Feb. 11, 2014

(54) GEO-COOLED PHOTOVOLTAIC POWER CONVERTER

(75) Inventor: Richard Travis West, Ragged Point, CA (US)

(73) Assignee: Renewable Power Conversion, Inc., San Luis Obispo, CA (US)

( * ) Notice: Subject to any disclaimer, the term of this patent is extended or adjusted under 35 U.S.C. 154(b) by 215 days.

(21) Appl. No.: 13/570,218

(22) Filed: Aug. 8, 2012

(51) Int. Cl.
*H02N 6/00* (2006.01)
*F25B 29/00* (2006.01)
*F28D 15/00* (2006.01)

(52) U.S. Cl.
USPC ............ 136/246; 165/4; 165/45; 165/104.14; 165/104.19; 165/104.21; 165/104.27; 165/104.33; 136/259

(58) Field of Classification Search
USPC ........ 165/201, 4, 45, 104.11, 104.14, 104.19, 165/104.21, 104.26, 104.27, 104.33, 170; 136/205, 210, 246, 259
See application file for complete search history.

(56) References Cited

U.S. PATENT DOCUMENTS

| | | | | |
|---|---|---|---|---|
| 3,924,954 A * | 12/1975 | Decret et al. | | 136/259 |
| 3,986,021 A * | 10/1976 | Hitchcock | | 136/246 |
| 3,991,741 A * | 11/1976 | Northrup et al. | | 136/246 |
| 4,021,323 A * | 5/1977 | Kilby et al. | | 136/246 |
| 4,075,034 A * | 2/1978 | Butler | | 136/246 |
| 4,172,740 A * | 10/1979 | Campbell, III | | 136/246 |
| 4,202,715 A * | 5/1980 | Ziemba | | 136/246 |
| 4,217,147 A * | 8/1980 | Ziemba | | 136/246 |
| 4,830,677 A * | 5/1989 | Geisler, Jr. | | 136/246 |
| 4,841,946 A * | 6/1989 | Marks | | 126/575 |
| 5,269,851 A * | 12/1993 | Horne | | 136/246 |
| 5,394,075 A * | 2/1995 | Ahrens et al. | | 136/246 |
| 5,445,177 A * | 8/1995 | Laing et al. | | 136/246 |
| 5,575,860 A * | 11/1996 | Cherney | | 136/246 |
| 5,932,885 A * | 8/1999 | DeBellis et al. | | 136/253 |
| 6,372,978 B1* | 4/2002 | Cifaldi | | 136/248 |
| 6,463,672 B1* | 10/2002 | Lai et al. | | 136/244 |
| 6,489,553 B1* | 12/2002 | Fraas et al. | | 136/246 |
| 6,498,290 B1* | 12/2002 | Lawheed | | 136/246 |
| 6,857,269 B2* | 2/2005 | Baker | | 60/653 |
| 6,918,254 B2* | 7/2005 | Baker | | 165/104.26 |
| 7,076,965 B2* | 7/2006 | Lasich | | 136/246 |
| 7,100,369 B2* | 9/2006 | Yamaguchi et al. | | 60/324 |
| 7,253,353 B2* | 8/2007 | Stabler | | 136/205 |
| 7,451,612 B2* | 11/2008 | Mueller et al. | | 62/260 |
| 7,767,903 B2* | 8/2010 | Marshall | | 136/243 |
| 8,104,465 B2* | 1/2012 | Kribus et al. | | 136/246 |
| 8,165,435 B2* | 4/2012 | Martin-Lopez | | 136/243 |
| 8,180,505 B2* | 5/2012 | Simburger et al. | | 136/246 |
| 8,207,821 B2* | 6/2012 | Roberge et al. | | 340/9.11 |
| 8,378,621 B2* | 2/2013 | Singhal et al. | | 136/246 |
| 8,448,876 B2* | 5/2013 | Yang | | 165/45 |
| 2002/0060556 A1* | 5/2002 | Wall | | 322/29 |
| 2004/0178641 A1* | 9/2004 | Wall | | 290/52 |
| 2008/0078435 A1* | 4/2008 | Johnson | | 136/206 |
| 2008/0092541 A1* | 4/2008 | Palmer | | 60/641.15 |
| 2008/0131830 A1* | 6/2008 | Nix | | 432/220 |
| 2008/0217998 A1* | 9/2008 | Parmley | | 307/65 |
| 2009/0120090 A1* | 5/2009 | DuBois | | 60/641.2 |
| 2009/0120091 A1* | 5/2009 | DuBois | | 60/641.3 |
| 2009/0315330 A1* | 12/2009 | Dederick | | 290/53 |
| 2010/0133903 A1* | 6/2010 | Rufer et al. | | 307/22 |
| 2010/0154855 A1* | 6/2010 | Nemir et al. | | 136/205 |
| 2011/0001436 A1* | 1/2011 | Chemel et al. | | 315/291 |
| 2011/0001438 A1* | 1/2011 | Chemel et al. | | 315/297 |

* cited by examiner

*Primary Examiner* — Ljiljana Ciric

(57) ABSTRACT

A geo-cooled photovoltaic power conversion apparatus including a cooling system having liquid-to-earth sub-grade heat exchanger, multiple cooling loops, and a coolant reservoir which provides thermal storage for the cooling system.

12 Claims, 5 Drawing Sheets

GEO-COOLED PHOTOVOLTAIC POWER CONVERTER

BACKGROUND OF THE INVENTION

Prior-art large scale photovoltaic power converters essentially use three types of heat removal systems, forced air convection, liquid cooling or a combination of the two. In the forced convection case, fans are required to move ambient air across power converter heat producing or heat-sinking components such as semiconductor devices coupled to heatsinks, magnetic components and power capacitors. In the case of prior-art liquid cooling, fans are used to remove heat from a liquid-to-air heat exchanger. In all cases, the ambient air carries particulate contamination that over time decreases the efficiency of the power converter heat-removal systems. Air filters are not a viable option because of maintenance costs as filters cannot be replaced after every dust storm. Cooling fans are typically the least reliable component in a power conversion system and fan replacement is categorically the highest maintenance cost item over the life of the power converter.

The present invention is a liquid cooled photovoltaic power converter with a liquid-to-earth heat exchanger. With the invention, removal of heat from primary power converter heat sources is accomplished without cooling fans or ambient air exchange in order to eliminate associated particulate contamination and maintenance issues.

BRIEF SUMMARY OF THE INVENTION

The preferred embodiment of the invention is a liquid cooled photovoltaic power converter with a liquid-to-earth heat exchanger. A number of closely related invention variants are disclosed including heat removal from heat producing components within the power converter using; liquid cooled chill plates for primary, conducted heat removal, liquid-to-air heat exchangers for secondary heat removal by forced convection and combinations of both. In the case of liquid-to-air heat exchangers, two sub-variants are disclosed, (i) an open system where a fan is used to draw ambient air through a geo-cooled, liquid-to-air heat exchanger to pre-cool ambient air before directing this air over secondary, less contaminate sensitive heat producing power converter components, like filter chokes and transformers and (ii) a closed system where a fan is used to circulate air inside the power converter enclosure through a geo-cooled, liquid-to-air heat exchanger and over secondary heat producing power converter components to reduce component and interior enclosure temperatures. In the case of the closed system, an opportunity exists to thermally insulate the skin of the power converter from radiant solar gain.

The preferred embodiment of the invention uses a large coolant reservoir to provide mass thermal storage wherein the temperature of the coolant is raised during the solar day when the power converter is producing power and then lowered during the night by heat exchange though a sub-grade heat exchanger.

The geo-cooling solution is a natural fit for large solar power plants where a large land area is available for the sub-grade heat exchanger and where piping for the heat exchanger can be place in the same trenches as the photovoltaic system wiring conduits. In addition, metallic heat exchanger piping can serve double-duty as the photovoltaic system ground grid.

DETAILED DESCRIPTION OF THE INVENTION

Figure 1:
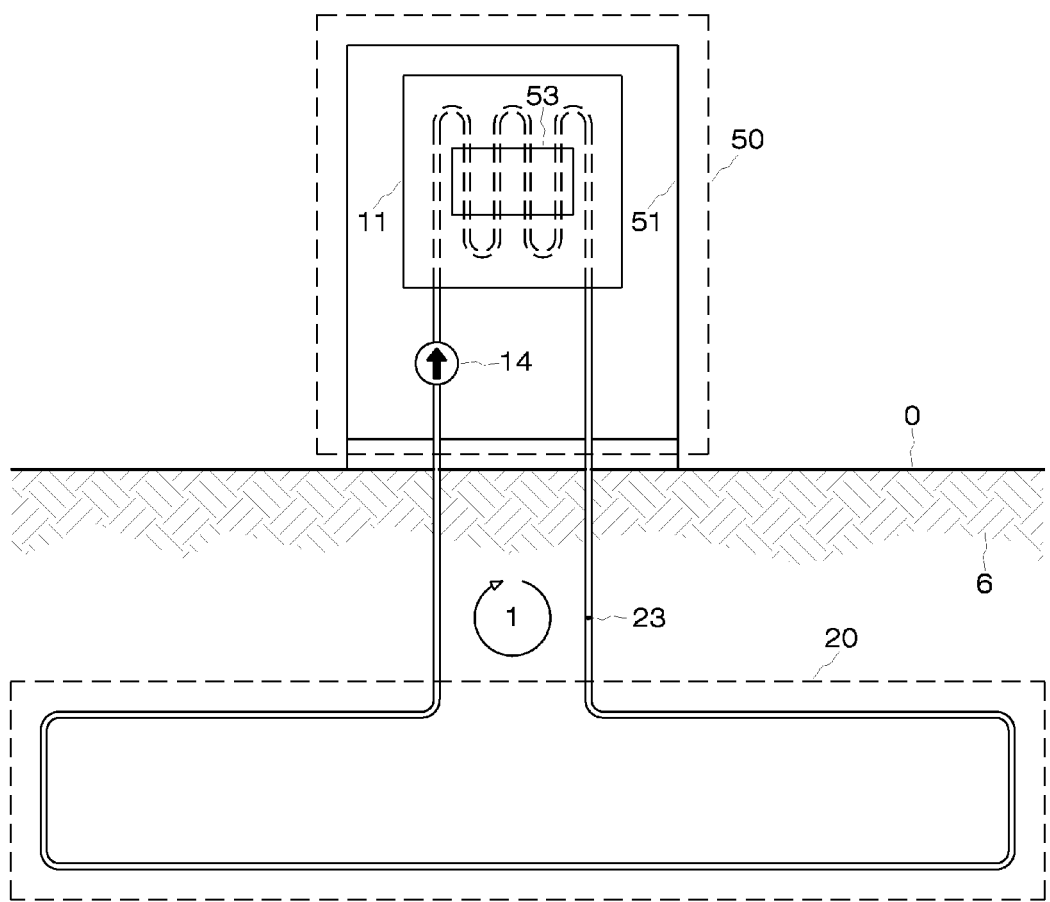
FIG. 1 is a schematic representation of the most basic form of the invention as a geo-cooled solar photovoltaic power conversion apparatus.

FIG. 1 illustrates the most basic form of the invention as a geo-cooled solar photovoltaic power conversion apparatus comprising; power converter 50, sub-grade heat exchanger 20 and coolant loop 1. Power converter 50 comprises; enclosure 51, power converter heat producing components including but not limited to semiconductor devices, inductors, transformers, power capacitors and power supplies, referenced collectively as heat producing components 53, power converter heat exchanger 11 and coolant pump 14. Sub-grade heat exchanger 20 is essentially a network of manifolds and pipes, tubing or other conduits buried in earth 6 and thermally coupled to earth 6. Coolant loop 1 provides a path for coolant 23 through power converter heat exchanger 11 and sub-grade heat exchanger 20. Coolant pump 14 circulates liquid coolant 23 through coolant loop 1. Heat transfer from power converter heat producing components 53 to earth 6 is accomplished by transferring heat from heat producing components 53 to power converter heat exchanger 11, to liquid coolant 23, to sub-grade heat exchanger 20, to earth 6. All area below earth grade line 0 is sub-grade.

In FIG. 1 power converter heat exchanger 11 is shown schematically as a chill plate but could also be configured as a liquid-to-air heat exchanger or radiator with or without a fan wherein thermal coupling from heat producing components 53 to power converter heat exchanger 11 is accomplished with convection rather than conduction.

Figure 2:
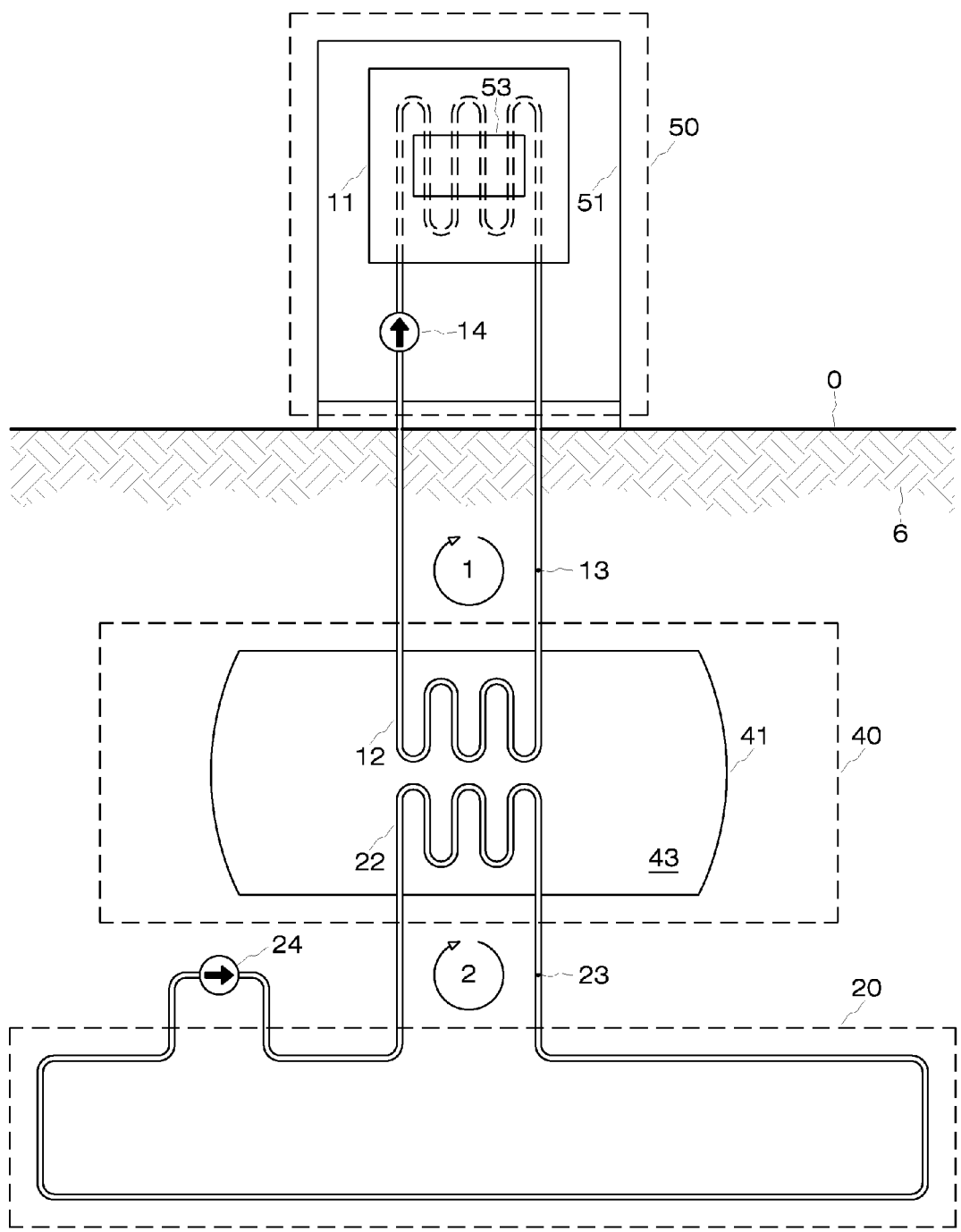
FIG. 2 shows a geo-cooled solar photovoltaic power conversion apparatus with two closed liquid cooling loops and a liquid coolant reservoir.

FIG. 2 shows a geo-cooled solar photovoltaic power conversion apparatus with two cooling loops, shown schematically as coolant loop 1 and coolant loop 2. Photovoltaic power converter 50 comprises; enclosure 51, heat producing components including but not limited to; semiconductor devices, inductors, transformers, power capacitors and power supplies, referenced collectively as heat producing components 53, power converter heat exchanger 11 and coolant pump 14. Coolant reservoir 40 comprises; tank 41 filled with liquid coolant 43, reservoir heat exchanger 12 and reservoir heat exchanger 22. Sub-grade heat exchanger 20 comprises a network of manifolds, pipes, tubing or other conduits buried in earth 6 and thermally coupled to earth 6. Power converter 50 essentially sits at earth grade 0 and all area below earth grade line 0 is sub-grade. Coolant loop 1 provides a path for coolant 13 through power converter heat exchanger 11 and reservoir heat exchanger 12. Coolant loop 2 provides a path for coolant 23 through reservoir heat exchanger 22 and sub-grade heat exchanger 20. Coolant pump 14 circulates liquid coolant 13 through coolant loop 1 and coolant pump 24 circulates liquid coolant 23 through coolant loop 2. Heat transfer from power converter heat producing components 53 to earth 6 is accomplished by transferring heat from heat producing components 53 to power converter heat exchanger 11, to liquid coolant 13, to reservoir heat exchanger 12, through liquid coolant 43, to coolant reservoir heat exchanger 22, to liquid coolant 23, to sub-grade heat exchanger 20, to earth 6. Coolant reservoir 40 provides bulk thermal storage for the cooling system. As shown in FIG. 2, coolant loops 1 and 2 are closed systems wherein liquid coolants 13 and 23 do not mix, and do not mix with liquid coolant 43. In a variant not shown in FIG. 2, reservoir heat exchangers 12 and 22 may be eliminated and coolants 13, 23 and 43 would mix in/as a single closed system.

Figure 3:
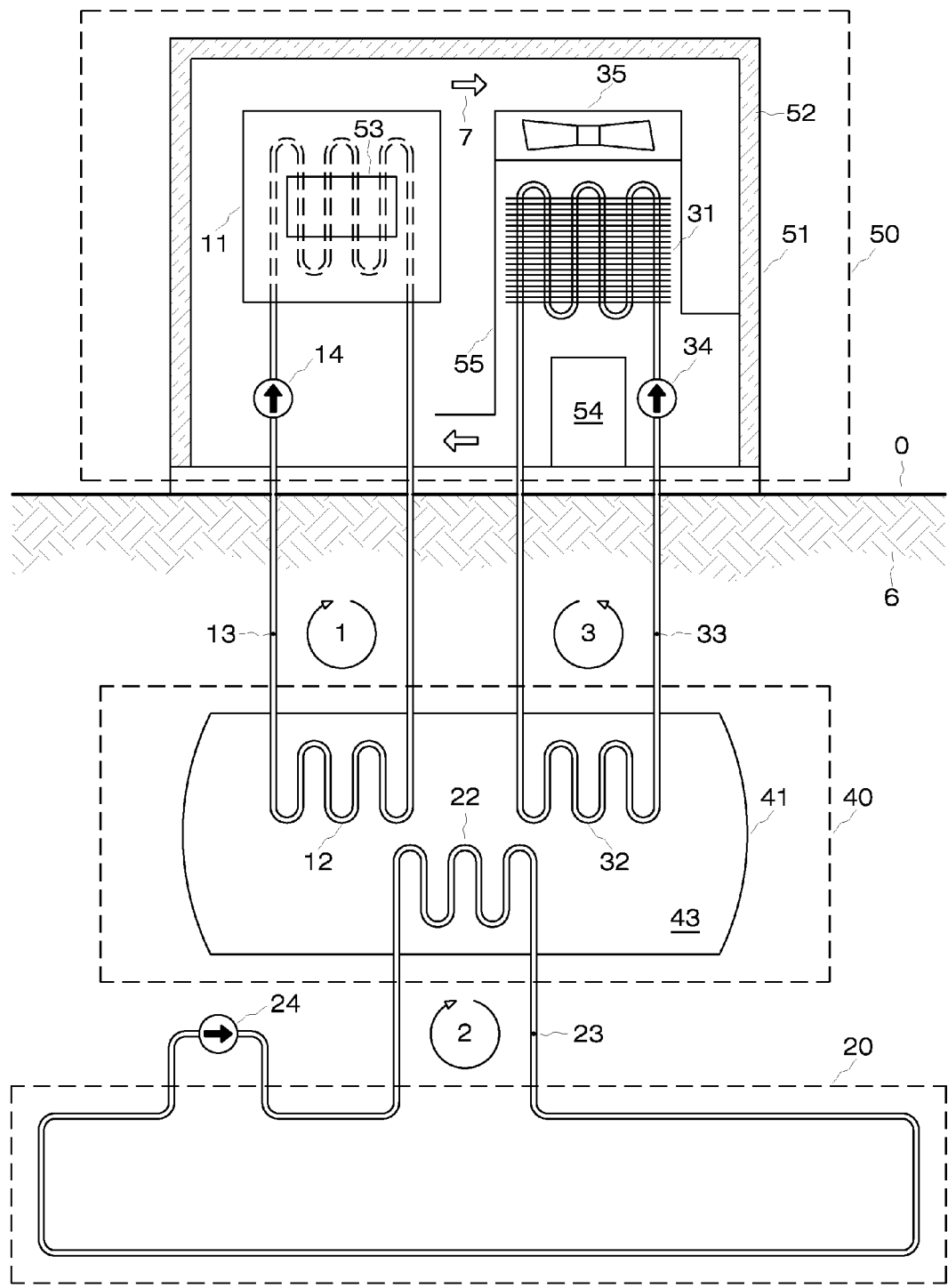
FIG. 3 shows a geo-cooled solar photovoltaic power conversion apparatus with three closed liquid cooling loops, a liquid coolant reservoir and a supplemental closed forced-convection cooling subsystem within the power converter enclosure.

FIG. 3 shows a geo-cooled solar photovoltaic power conversion apparatus with three cooling loops, shown schematically as coolant loops 1, 2 and 3 and is the preferred embodiment of the invention. Photovoltaic power converter 50 comprises; enclosure 51, enclosure thermal insulation 52, primary heat producing components including but not limited to; semiconductor devices, inductors, transformers and power capacitors, referenced collectively as primary heat producing components 53, secondary heat producing components including but not limited to; inductors, transformers, power capacitors and power supplies, referenced collectively secondary heat producing components 54, power converter chill plate heat exchanger 11, power converter air-to-liquid heat exchanger 31, cooling fan 35, air plenum 55, coolant pump 14 and coolant pump 34. Coolant reservoir 40 comprises; tank 41 filled with liquid coolant 43, and reservoir heat exchangers 12, 22 and 32. Sub-grade heat exchanger 20 comprises a network of manifolds, pipes, tubing or other conduits buried in earth 6 and thermally coupled to earth 6. Power converter 50 essentially sits at earth grade 0 and all area below earth grade line 0 is sub-grade. Coolant loop 1 provides a path for liquid coolant 13 through power converter heat exchanger 11 and reservoir heat exchanger 12. Coolant loop 2 provides a path for liquid coolant 23 through reservoir heat exchanger 22 and sub-grade heat exchanger 20. Coolant loop 3 provides a path for liquid coolant 33 through power converter air-to-liquid heat exchanger 31 and reservoir heat exchanger 32. Coolant pump 14 circulates liquid coolant 13 through coolant loop 1, coolant pump 24 circulates liquid coolant 23 through coolant loop 2 and coolant pump 34 circulates liquid coolant 33 through coolant loop 3. Heat transfer from primary power converter heat producing components 53 to earth 6 is accomplished by transferring heat from primary heat producing components 53 to power converter heat exchanger 11, to liquid coolant 13, to reservoir heat exchanger 12, through liquid coolant 43, to coolant reservoir heat exchanger 22, to liquid coolant 23, to sub-grade heat exchanger 20, to earth 6. Heat transfer from secondary power converter heat producing components 54 to earth 6 is accomplished by transferring heat from secondary heat producing components 54 through air within power converter enclosure 51 circulated by fan 35 and directed as shown by arrows 7 by air plenum 55, to power converter air-to-liquid heat exchanger 31, to liquid coolant 33, to reservoir heat exchanger 32, through liquid coolant 43, to coolant reservoir heat exchanger 22, to liquid coolant 23, to sub-grade heat exchanger 20, to earth 6. Coolant reservoir 40 provides bulk thermal storage for the cooling system. As shown in FIG. 3, coolant loops 1 2 and 3 are closed systems wherein liquid coolants 13, 23 and 33 do not mix, and do not mix with liquid coolant 43.

Figure 4:
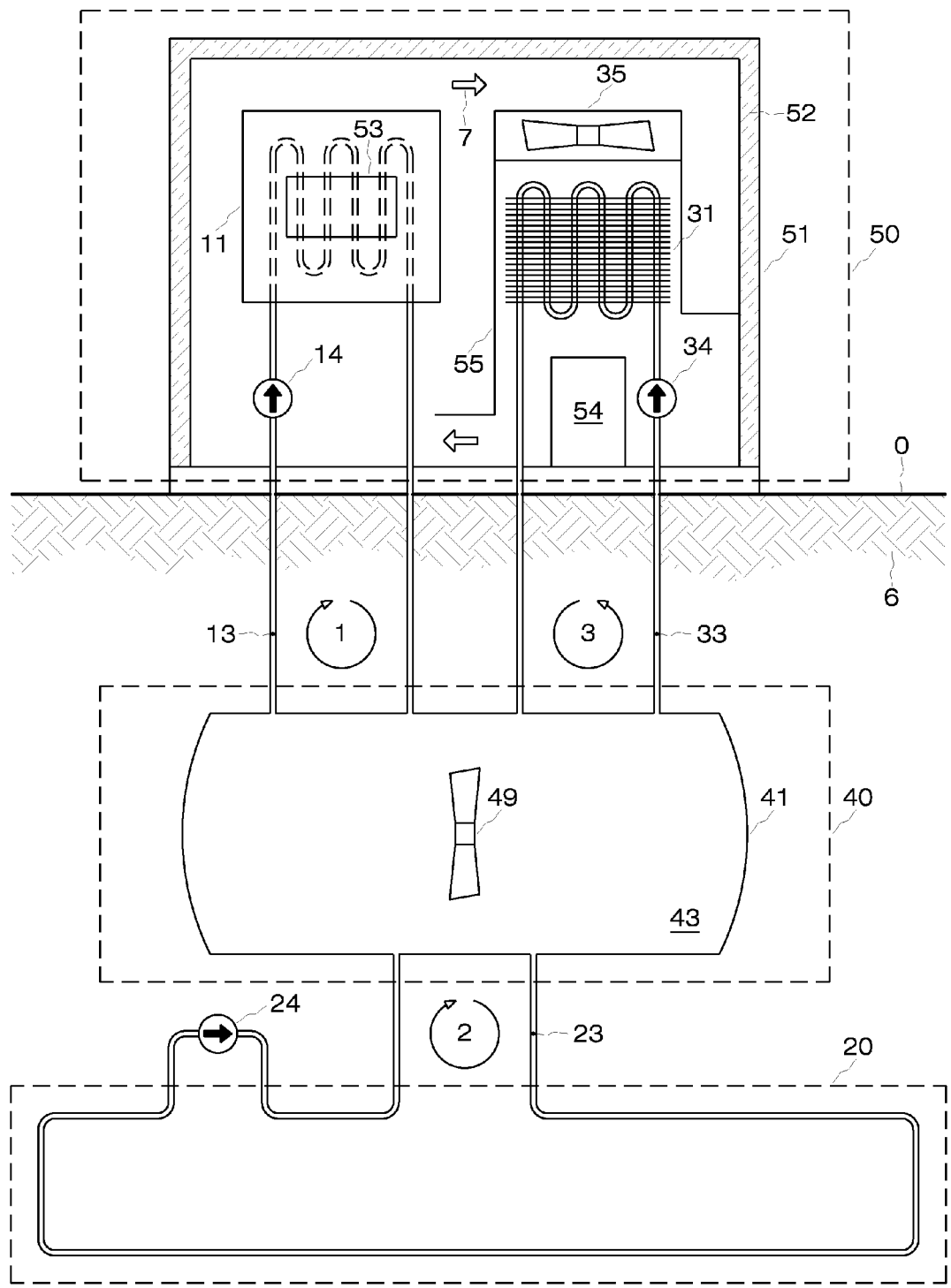
FIG. 4 shows a geo-cooled solar photovoltaic power conversion apparatus with three cooling liquid cooling loops, a liquid coolant reservoir where coolants in the three loops and the reservoir mix freely and a supplemental closed forced-convection cooling subsystem within the power converter enclosure.

FIG. 4 is identical to FIG. 3 except that heat exchangers 12, 22 and 32 are removed from coolant reservoir 40 such that liquid coolants 13, 23, 33 and 43 are common and form one closed coolant system. In one additional variant, impeller 49 is added to coolant reservoir 40 to circulate liquid coolant 43 within tank 41.

Figure 5:
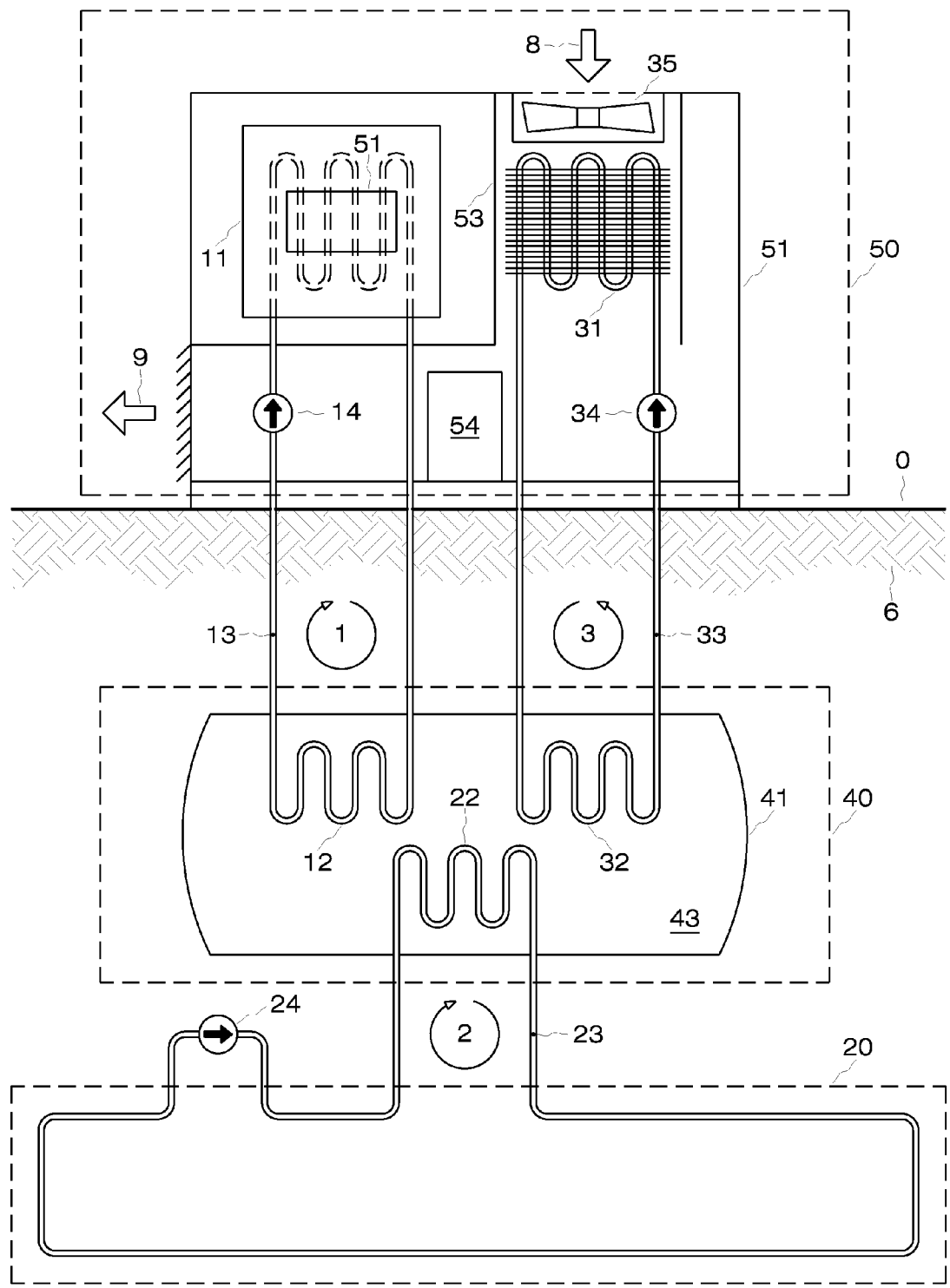
FIG. 5 shows a geo-cooled solar photovoltaic power conversion apparatus with three closed liquid cooling loops, a liquid coolant reservoir and a supplemental open forced-convection cooling subsystem within the power converter enclosure.

FIG. 5 is essentially identical to FIG. 3 except that ambient air 8 external to enclosure 51 is pushed through power converter air-to-liquid heat exchanger 31 by fan 35 and is directed over power converter secondary heat producing components 54 and then forced out of an exhaust port as shown by arrow 9. In normal power converter operation, external ambient air 8 is pre-cooled by power converter air-to-liquid heat exchanger 31 before being used to convection-cool power converter secondary heat producing components 52. In a simple variant of the configuration shown in FIG. 5, power converter air-to-liquid heat exchanger 31 by fan 35 positions may be transposed so that air 8 is pulled through power converter air-to-liquid heat exchanger 31 by fan 35.

The geo-cooling systems disclosed herein may also be used as geo-heating systems to heat power converter 50 to prevent condensation or frost within power converter enclosure 51 during the night or during periods of low or no photovoltaic power production.

The sub-grade heat exchangers (20) disclosed herein may share trenches with sub-grade photovoltaic system wiring conduits.

The sub-grade heat exchangers (20) disclosed herein may comprise metallic pipe, metallic tubing or other metallic conduits that may be bonded to the photovoltaic system ground grid to function as or to augment the photovoltaic system ground grid.

In FIGS. 2 through 5, coolant pump 24 is shown for clarity in a sub-grade location. In practice coolant pump 24 may be located above-grade to facilitate ease of maintenance and replacement.

In FIGS. 2 through 5, liquid coolant reservoir 40 is shown in a sub-grade location but may also be located above-grade to facilitate ease of maintenance and replacement.

In practice, the geo-cooled solar photovoltaic power conversion apparatuses disclose herein will comprise a means to control the speed of said liquid coolant pumps (14, 24, 34) as some function of at least one of the temperature of any said coolant, ambient air temperature, photovoltaic power converter temperature, the temperature of at least one heat producing component, the temperature of the earth or the power converter output power.

The liquid coolant reservoir disclosed herein (40) may provide enough thermal capacity to essentially absorb enough heat from all the power converter heat producing components to operate the heat producing components within their thermal capabilities during daylight hours to either reduce the heat removal demand of the sub-grade heat exchanger or eliminate it completely.

The invention is a novel way of cooling photovoltaic power converters which utilizes the large land area required for solar power plants and/or bulk liquid storage as heat sinks or a heat sink, respectively, for photovoltaic power converter waste heat. In the preferred embodiment of the invention, there is no air exchange between outside ambient air and air within the power converter enclosure in order to prevent particulate contamination of sensitive power converter components. In addition, prior-art, anti-condensation heaters interior to the power converter enclosure are eliminated by geo-heating the power converter at night.

What I claim as my invention is:

1. A geo-cooled solar photovoltaic power conversion apparatus comprising: a photovoltaic power converter including one or more heat producing components; a power converter heat exchanger; a sub-grade heat exchanger thermally coupled to the earth; a liquid coolant reservoir including a tank, a first reservoir heat exchanger interior to the tank, and a second reservoir heat exchanger interior to the tank, wherein the first reservoir heat exchanger and the second reservoir heat exchanger are thermally coupled to each other via a liquid interior to the tank; a first coolant loop including a first liquid coolant and operably connecting the power converter heat exchanger, the first reservoir heat exchanger, and a first coolant pump, wherein the first coolant pump is operable to circulate the first liquid coolant through the power converter heat exchanger and through the first reservoir heat exchanger; and, a second coolant loop including a second liquid coolant and operably connecting the sub-grade heat exchanger, the second reservoir heat exchanger, and a second coolant pump, wherein the second coolant pump is operable to circulate the second liquid coolant through the second reservoir heat exchanger and through the sub-grade heat exchanger.

2. The geo-cooled solar photovoltaic power conversion apparatus according to claim 1, wherein the power converter heat exchanger comprises a chill plate such that said one or more heat producing components are thermally coupled to the chill plate and such that the chill plate in turn comprises a means for channeling and thermally coupling said first liquid coolant through and to the chill plate, respectively.

3. The geo-cooled solar photovoltaic power conversion apparatus according to claim 1, further comprising: a third reservoir heat exchanger within the coolant reservoir tank, wherein the liquid interior to the tank thermally couples the third reservoir heat exchange to each of the first reservoir heat exchanger and the second reservoir heat exchanger within the liquid coolant reservoir tank; and, a third coolant loop, the third coolant loop including a third liquid coolant and operably connecting the third reservoir heat exchanger, a power converter liquid-to-air heat exchanger, and a third coolant pump, wherein the third coolant pump is operable to circulate the third liquid coolant through the third reservoir heat exchanger, a power converter liquid-to-air heat exchanger and a means for thermally coupling air between the power converter liquid-to-air heat exchanger and said one or more heat producing components.

4. The geo-cooled solar photovoltaic power conversion apparatus according to claim 3 further comprising: a power converter enclosure; a fan; an intake port; an exhaust port; and, a means for enabling the fan to direct ambient air, external to the power converter enclosure, through the intake port, through the power converter liquid-to-air heat exchanger, through the power converter enclosure, across heat producing components and through the exhaust port to the exterior of the enclosure.

5. The geo-cooled solar photovoltaic power conversion apparatus according to claim 1, wherein the power converter heat exchanger in turn comprises a chill plate and a liquid-to-air heat exchanger, wherein at least one of said one or more heat producing components is thermally coupled to the chill plate, and wherein the chill plate in turn comprises a means for channeling and thermally coupling said first liquid coolant through and to the chill plate, respectively, wherein at least one of said one or more heat producing components is thermally coupled via air to the power converter liquid-to-air heat exchanger, and, wherein said first coolant loop also provides a path for the first liquid coolant through the liquid-to-air heat exchanger.

6. The geo-cooled solar photovoltaic power conversion apparatus according to claim 1, wherein said sub-grade heat exchanger comprises pipes or conduits that are buried in essentially the same trenches as electrical wiring associated with the photovoltaic power conversion system.

7. The geo-cooled solar photovoltaic power conversion apparatus according to claim 1, wherein said sub-grade heat exchanger comprises metallic pipes and a means for coupling said metallic pipes to a photovoltaic electrical ground grid as an integral portion of the photovoltaic electrical ground grid.

8. The geo-cooled solar photovoltaic power conversion apparatus according to claim 1 further comprising a means for continuously circulating the first liquid coolant and/or the second liquid coolant so as to warm the photovoltaic power converter and prevent water condensation.

9. The geo-cooled solar photovoltaic power conversion apparatus according to claim 1, further comprising a means for circulating said liquid in said coolant reservoir tank.

10. The geo-cooled solar photovoltaic power conversion apparatus according to claim 1, wherein said one or more heat producing components comprise at least one of semiconductor devices, water-cooled magnetic components, air-cooled magnetic components, water-cooled capacitors or air-cooled capacitors.

11. The geo-cooled solar photovoltaic power conversion apparatus according to claim 1 further comprising: a means for controlling said first coolant pump and/or said second coolant pump as a function of at least one of the temperature of said first coolant, the temperature of the second coolant, the ambient air temperature, the photovoltaic power converter temperature, the temperature of at least one of the one or more heat producing components, and, the temperature of the earth.

12. The geo-cooled solar photovoltaic power conversion apparatus according to claim 1, wherein said liquid coolant reservoir comprises a means for providing enough thermal capacity to absorb the heat from said one or more heat producing components during daylight hours when the photovoltaic power converter is converting solar power.

* * * * *